United States Patent
Kobayashi

(10) Patent No.: US 7,851,258 B2
(45) Date of Patent: Dec. 14, 2010

(54) METHOD OF MANUFACTURING AN RFID TAG

(75) Inventor: Hiroshi Kobayashi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 216 days.

(21) Appl. No.: 11/983,868

(22) Filed: Nov. 13, 2007

(65) Prior Publication Data

US 2008/0173997 A1    Jul. 24, 2008

(30) Foreign Application Priority Data

Jan. 18, 2007    (JP) ............................. 2007-009263

(51) Int. Cl.
    *H01L 21/00*    (2006.01)
(52) U.S. Cl. ..................... 438/108; 438/126; 438/118; 257/E21.503
(58) Field of Classification Search ................ 438/108, 438/126, 118
    See application file for complete search history.

(56) References Cited

U.S. PATENT DOCUMENTS

| 6,406,990 B1 | 6/2002 | Kawai |
| 6,617,521 B1 * | 9/2003 | Saito et al. ................... 174/260 |
| 6,664,645 B2 | 12/2003 | Kawai |
| 6,853,086 B1 * | 2/2005 | Nakayama ................... 257/778 |
| 6,973,716 B2 * | 12/2005 | Chung et al. .................. 29/832 |
| 7,193,328 B2 * | 3/2007 | Suzuki et al. ................ 257/778 |
| 7,364,088 B2 * | 4/2008 | Baba ........................... 235/492 |
| 2003/0006509 A1 | 1/2003 | Suzuki et al. |
| 2004/0149489 A1 | 8/2004 | Ferrando et al. |
| 2005/0287705 A1 | 12/2005 | Yang |
| 2006/0208094 A1 * | 9/2006 | Ishikawa et al. ............ 235/492 |

FOREIGN PATENT DOCUMENTS

| CN | 1300180 A | 6/2001 |
| CN | 1396653 A | 2/2003 |
| JP | 9-172041 | 6/1997 |
| JP | 2001-156110 | 6/2001 |
| JP | 2005-004430 | 1/2005 |

OTHER PUBLICATIONS

Extended European Search Report, mailed Sep. 3, 2009 and issued in corresponding European Patent Application No. 07121154.4-2214.

* cited by examiner

*Primary Examiner*—David A Zameke
(74) *Attorney, Agent, or Firm*—Greer, Burns and Crain, Ltd.

(57) ABSTRACT

A method of manufacturing an RFID tag that includes forming an antenna pattern and a reinforcing layer on one surface of a film made of a resin material, applying a thermosetting adhesive onto the reinforcing layer and the antenna pattern, mounting a circuit chip on the antenna pattern via the thermosetting adhesive, pinching the circuit chip and the other surface of the film, and fixing the circuit chip to the antenna pattern by hardening the thermosetting adhesive. The reinforcing layer is formed within a region where the circuit chip is mounted and the circuit chip includes a first protrusion contacting the antenna pattern and a second protrusion contacting the reinforcing layer.

4 Claims, 11 Drawing Sheets

METHOD OF MANUFACTURING AN RFID TAG

BACKGROUND OF THE INVENTION

1. Field of the Invention

The present invention relates to an electronic device and a method of manufacturing the same, especially to an electronic device in which a circuit chip is mounted on a film-shaped base body and a method of manufacturing the same.

2. Description of the Related Art

Conventionally, there has been widely known an electronic device in which a circuit chip is mounted on a base such as a printed circuit board. Such an electronic device is built in an electronic equipment to control the electronic equipment, or used alone to exchange information with external equipment. Such an electronic device includes Radio Frequency Identification (RFID) tags of various kinds that wirelessly exchange information in a non-contact manner with an external device typified by a reader/writer. One type of RFID tag that has been proposed has a structure in which a conductor pattern for radio communication and an IC chip are mounted on a sheet-like base. Applications of such an RFID tag include identification of an article by attaching the RFID tag to the article and thereby exchanging information about the article with external equipment.

Incidentally, there is the demand for a more compact and lighter RFID. Specifically, a thinner and more flexible RFID with decreased cost is demanded. In response to such a demand, there has been proposed a RFID tag in which a film formed of a resin material such as polyethylene terephthalate (PET) is used as a base on which an IC chip is mounted (See Japanese Patent Application Laid-open No. 2001-156110, for example).

FIG. 10 is a drawing for explaining a conventional method of manufacturing a RFID tag.

In Part (a) to Part (d) of FIG. 10, each step for manufacturing a RFID tag is sequentially shown.

To manufacture a RFID tag, firstly, as shown in Part (a) of FIG. 10, a base body 91 composed of a film 911 made of the PET and a conductive pattern 912 formed on the film 911 that functions as an antenna of the RFID tag is prepared, and a thermosetting adhesive 93p that hardens by heating is adhered to the base body 91.

Next, as shown in Part (b) of FIG. 10, an IC chip 92 is placed on a portion of the base body 91 where the thermosetting adhesive 93p is adhered to. On the IC chip 92, bumps 921 connected to the conductive pattern 912 have been formed. As shown in Part (c) of FIG. 10, the IC chip 92 is placed on the base body 91 in such a way that the bumps 921 are aligned with the conductive pattern 912.

Next, as shown in Part (d) of FIG. 10, the base body 91 mounted with the IC chip 92 is pinched by a heating device 8 so as to be pressed on the IC chip 92 side (one side of the base body 91 where the IC chip 92 is mounted) and on a film 911 side (the other side of the base body 91 where the film 911 is disposed). The heating device 8 includes a heating head 81 that abuts the IC chip 92 and a heating stage 82 that abuts to support the base body 91. Then, the thermosetting adhesive 93p is hardened through the application of heat by the heating head 81 of the heating device 8. In this way, the IC chip 92 is fixed to the base body 91 in a state where the bumps 921 contact the conductive pattern 912, which completes a compact and lightweight RFID tag.

However, PET material that forms the film 911 is low in heat resistance as it has the glass transition temperature of about 67° C. Therefore, the film 911 is likely to deform when the thermosetting adhesive 93p is heated and hardened.

FIG. 11 is a diagram for explaining a state of the base body in the step of heating in Part (d) of FIG. 10.

As shown in Part (a) of FIG. 11, if the processing of heating is executed in a condition where the IC chip 92 is placed on the base body 91, the temperature of the base body 91 rises and as shown in Part (b) of FIG. 11, the film 911 becomes deformed. If the thermosetting adhesive 93p in the middle of hardening flows due to the deformation of the film 911, then air bubbles are generated in the thermosetting adhesive 93p and remain as voids 931 after the hardening is completed. As the voids in the solidified thermosetting adhesive 93p lowers the adhesion between the IC chip 92 and the base body 91, the reliability of RFID tags deteriorates.

A problem of degraded reliability due to the generation of voids like this is not limited to RFID tags but common to electronic devices in which a circuit chip is mounted on a film-shaped base body.

SUMMARY OF THE INVENTION

The present invention has been made in view of the above circumstances and provides an electronic device with improved reliability by suppressing the generation of voids, and a method of manufacturing the same.

A method of manufacturing an electronic device according to the present invention includes the steps of:

forming a conductive pattern on a film made of a resin material and thereby forming a base body on which a circuit chip is mounted;

forming a reinforcing layer that suppresses expansion and contraction of the film in at least one of a mounting area on the film which area the circuit chip is mounted on and a rear area at the back of the mounting area with the film interposed between the mounting area and the rear area;

applying a thermosetting adhesive onto one surface on which the conductive pattern of the base body is formed;

mounting the circuit chip that is to be connected to the conductive pattern on the mounting area of the base body via the thermosetting adhesive;

pinching the base body mounted with the circuit chip by a heating device that applies heat to the thermosetting adhesive and has a pressing section and a supporting section such that the pressing section abuts the circuit chip mounted on the base body and the supporting section abuts the film and thereby supports the base body; and fixing the circuit chip to the conductive pattern by hardening the thermosetting adhesive through heating by the heating device.

Here, the concept that "the reinforcing layer is formed in at least one of a mounting area and a rear area" includes a case in which the reinforcing layer is formed large enough to extend off the mounting area or the rear area.

According to the method of manufacturing the electronic device of the present invention, the base body mounted with the circuit chip is pinched between both sides of the heating device, between its pressing section and its supporting section, and the thermosetting adhesive is heated. Since on the film of the base body, the reinforcing layer for suppressing expansion and contraction of this film is formed, it is possible to suppress deformation even if the film is melted by the application of heat. Therefore, the generation of voids associated with the deformation of the film can be suppressed and the reliability of the electronic device can be improved. Also, as manufacturing yield of the electronic device is improved, production cost can be lowered.

Here, in the method of manufacturing an electronic device according to the present invention, it is desirable that the step of forming a reinforcing layer is executed in conjunction with the step of forming a conductive pattern in which the reinforcing layer is formed of the same material as the conductive pattern.

Since the reinforcing layer is formed of the same material as the conductive pattern and the step of forming a reinforcing layer is executed in conjunction with the step of forming a pattern, it is possible to form the reinforcing layer for suppressing the deformation of film in simplified process.

Further, in the method of manufacturing an electronic device according to the present invention, it is desirable that the step of forming a reinforcing layer is a step of forming the reinforcing layer in the mounting area; and the step of mounting is a step of mounting the circuit chip on the base body, the circuit chip having a first protrusion that contacts the conductive pattern and a second protrusion that contacts the reinforcing layer.

If the second protrusion provided in the circuit chip contacts the reinforcing layer, and when in the pinching step the base body mounted with the circuit chip is pinched by the heating device, the film is pressed against the supporting section by the reinforcing layer that contacts the circuit chip via the second protrusion. Therefore, the deformation of the film can be surely suppressed.

Furthermore, in the method of manufacturing an electronic device according to the present invention, it is desirable that the step of mounting is a step of mounting a circuit chip on the base body, the circuit chip having a plurality of first protrusions that contact the conductive pattern, and the step of forming a reinforcing layer is a step of forming in the rear area the reinforcing layer which has portions corresponding to the plurality of first protrusions.

If the reinforcing layer is formed in the rear area and has portions corresponding to the first protrusions, and when in the pinching step the base body mounted with the circuit chip is pinched by the heating device, the film becomes a state of being sandwiched between the conductive pattern that contacts the circuit chip via the first protrusions and the reinforcing layer. Therefore, also in this case, the deformation of the film can be surely suppressed.

Moreover, in the method of manufacturing an electronic device according to the present invention, it is desirable that the step of forming a reinforcing layer is a step of forming the reinforcing layer of an insulating material.

If the reinforcing layer is formed of an insulating material, it is possible to suppress interference against electromagnetic waves emitted from the conductive pattern and the generation of parasitic capacitance occurring against the conductive pattern.

In addition, an electronic device according to the present invention includes: a film made of a resin material; a conductive pattern disposed on the film; a circuit chip mounted on the film and electrically connected to the conductive pattern; and a reinforcing layer to suppress expansion and contraction of the film and is formed in at least one of a mounting area on the film which area the circuit chip is mounted on and a rear area at the back of the mounting area with the film interposed between the mounting area and the rear area.

Since the electronic device according to the present invention includes the reinforcing layer which is formed on the film for suppressing expansion and contraction of the film, the deformation of the film can be suppressed at the time of heating the thermosetting adhesive when the base body on which the circuit chip is mounted is pinched from both sides of the base body by the heating device. Therefore, according to the electronic device of the present invention, as voids in the thermosetting adhesive is less, the reliability can be improved.

Here, in the electronic device according to the present invention, it is desirable that the reinforcing layer is made of the same material as the conductive pattern and is formed on a surface of the film on which surface the conductive pattern is formed.

Additionally, in the electronic device according to the present invention, it is desirable that the reinforcing layer has been formed in the mounting area; and the circuit chip includes a first protrusion that contacts the conductive pattern and a second protrusion that contacts the reinforcing layer.

Yet furthermore, in the electronic device according to the present invention, it is desirable that the circuit chip has a first protrusion that contacts the conductive pattern, and the reinforcing layer is formed in the rear area and has a portion corresponding to the first protrusion.

Still furthermore, in the electronic device according to the present invention, it is desirable that the reinforcing layer is made of an insulating material.

As explained above, according to the present invention, by suppressing the generation of voids, it is possible to realize an electronic device with improved reliability and a method of manufacturing the same.

DETAILED DESCRIPTION OF THE INVENTION

The embodiments of the present invention will be described below with reference to the accompanying drawings.

Figure 1:
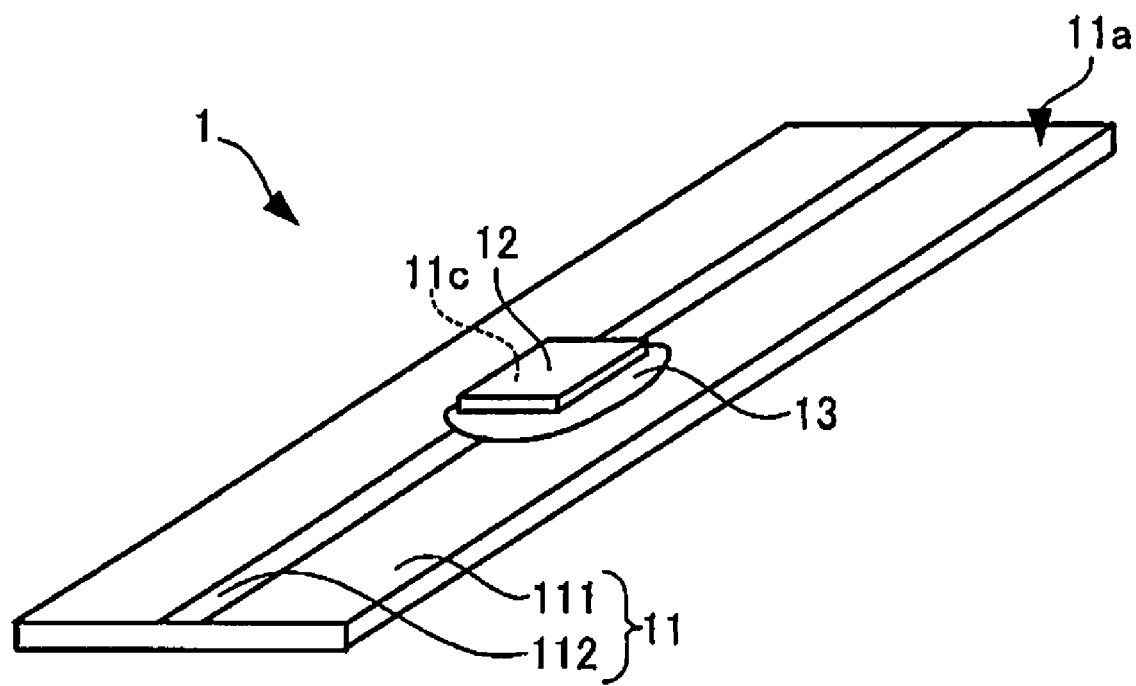
FIG. 1 is a perspective view showing a mounting surface on which an IC chip of a RFID tag according to a first embodiment of the present invention is mounted.
Figure 2:
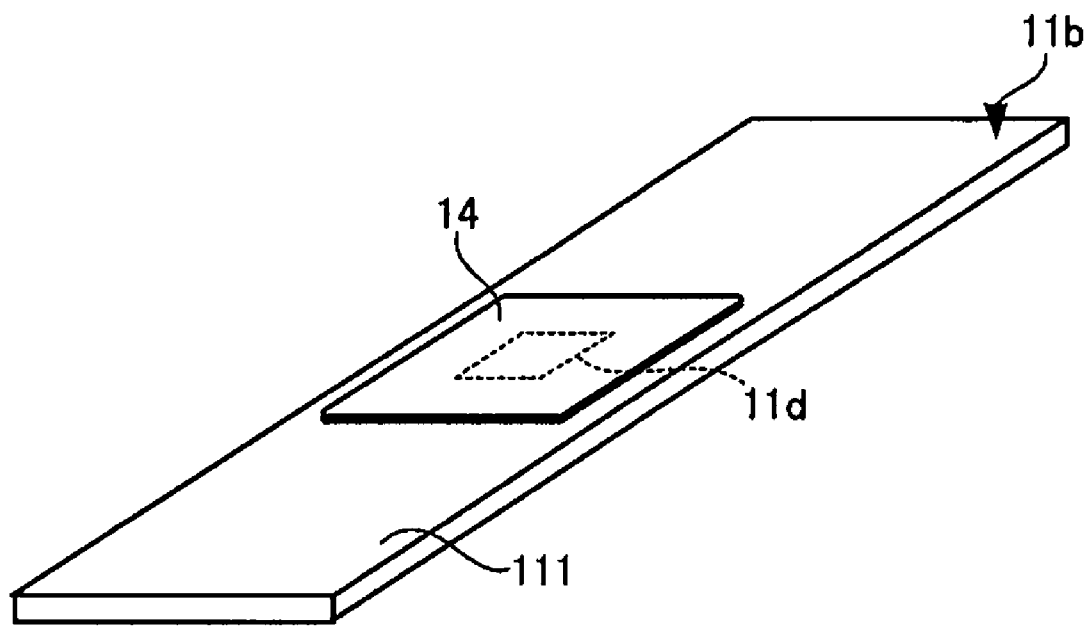
FIG. 2 is a perspective view showing at the backside of the RFID tag according to the first embodiment of the present invention.

FIGS. 1 and 2 are perspective views illustrating a RFID tag in the first embodiment of the present invention. FIG. 1 is a perspective view showing a mounting surface 11a on which an IC chip of a RFID tag 1 is mounted, and FIG. 2 is a perspective view showing a backside 11b opposite the mounting surface 11a.

The RFID tag 1 shown in FIGS. 1 and 2 includes a base body 11 composed of a film 111 made of a PET material and a metallic antenna pattern 112 formed on the film 111; an IC chip 12 mounted on the base body 11; and a thermosetting adhesive 13 for adhering the IC chip 12 to the base body 11. The IC chip 12 is mounted in a mounting area 11c of the mounting surface 11a on which the antenna pattern 112 of the base body 11 has been formed, and the IC chip 12 is electrically connected to the antenna pattern 112. Also, as shown in FIG. 2, on the film 111 of the RFID tag 1, a reinforcing layer 14 is formed over a rear area 11d on the back of the mounting area 11c (See FIG. 1). In the present embodiment, the reinforcing layer 14 is rectangular, has an area larger than the rear area 11d and is made of the same metallic material as the antenna pattern 112.

The RFID tag 1 in the present embodiment is an electronic device for exchanging data in a non-contact manner with a reader writer that is not shown. The RFID tag 1 receives energy of electromagnetic field emitted by the reader writer at the antenna pattern 112 as electric energy, and drives the IC chip 12 with the electric energy. The antenna pattern 112 functions as an antenna for communication, and the IC chip 12 performs radio wave communication via the antenna pattern 112.

Here, the RFID tag 1 corresponds to one example of the electronic device according to the present invention; the antenna pattern 112 corresponds to one example of the conductive pattern according to the present invention; and the IC chip 12 corresponds to one example of the circuit chip according to the present invention.

In addition, among those who are skilled in the technical field of the present invention, a "RFID tag" used in the present invention may be called as an "Inlay for RFID tag," since it is an internal component material for the "RFID tag." Also this "RFID tag" may be called as a "wireless IC tag." Additionally, this "RFID tag" also includes an IC card of a non-contact type.

Hereinafter, a method of manufacturing this RFID tag 1 will be explained.

Figure 3:
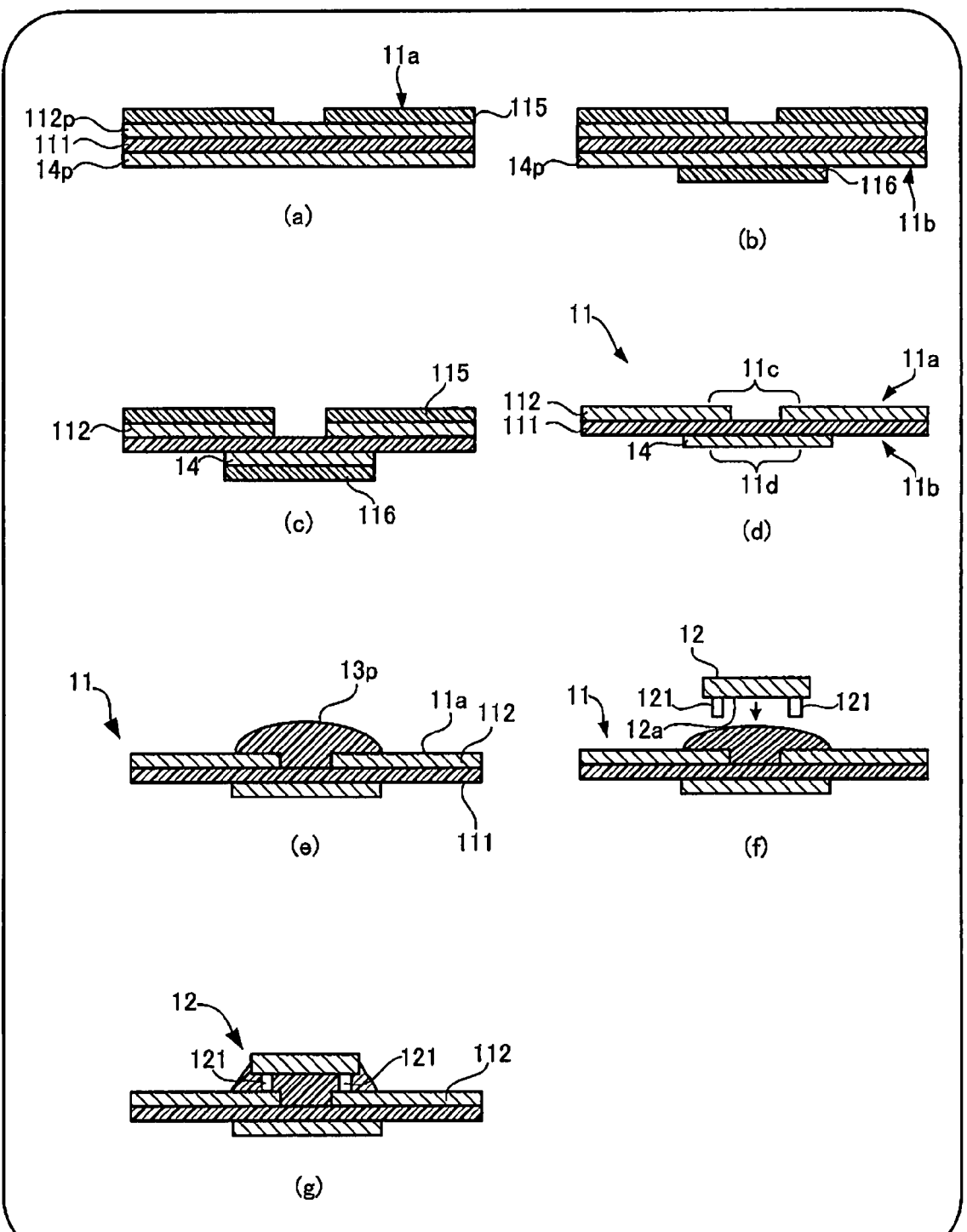
FIG. 3 is a drawing illustrating process of manufacturing the RFID tag shown in FIG. 1.
Figure 4:
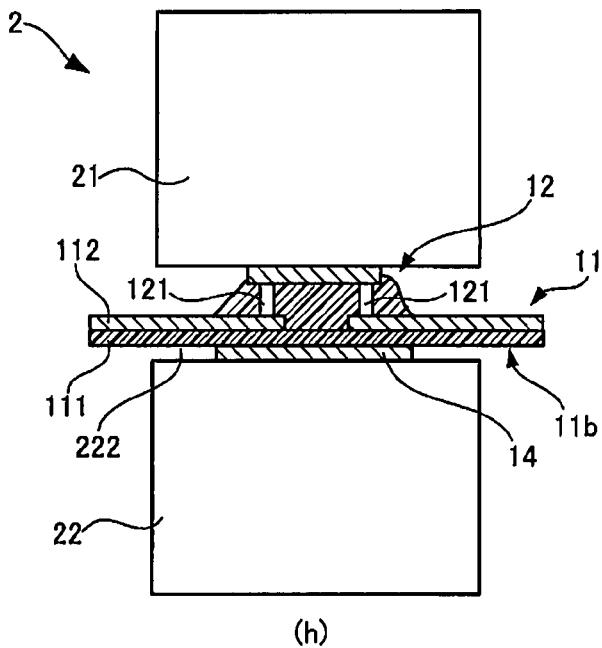
FIG. 4 is a drawing illustrating process of manufacturing the RFID tag following the process shown in FIG. 3.
Figure 4:
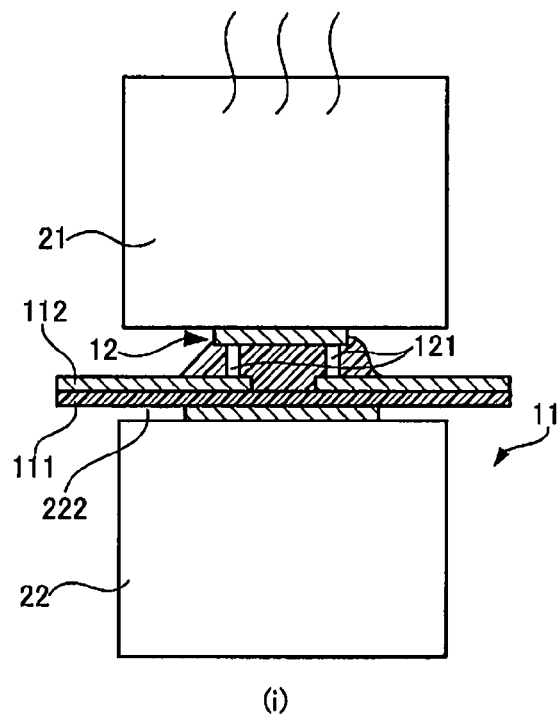

FIGS. 3 and 4 are drawings illustrating the process of manufacturing the RFID tag shown in FIG. 1.

In FIG. 3, each process of manufacturing the RFID tag 1 is sequentially shown from Part (a) to Part (g), and in FIG. 4, each process following the steps in FIG. 3 is sequentially shown from Part (h) to Part (i). For clarity of drawings, size of the RFID tag 1 in thickness direction and of the IC chip 12 are more exaggerated than those shown in FIG. 1.

In order to manufacture the RFID tag 1, firstly, in the process of forming a conductor shown in Part (a) to Part (d) of FIG. 3, the antenna pattern 112 is formed on the mounting surface 11a of the film 111. In this process of forming a conductor, the reinforcing layer 14 is formed on the backside 11b opposite the mounting surface 11a. To be more specific, in the process of forming a conductor, firstly, as shown in Part (a) of FIG. 3, metallic layers 112p and 14p made of copper are formed on both sides of the film 111: an antenna resist layer 115 that has a shape matching that of the antenna pattern is formed on the metallic layer 112p at one side of the film 111 directed to the mounting surface 11a. Next, as shown in Part (b) of FIG. 3, a reinforcing resist layer 116 that has a shape matching that of the reinforcing layer 14 is formed on the metallic layer 14p directed to the backside 11b. Then, an etching process is performed for the metallic layers 112p and 14p, and as shown in Part (c) of FIG. 3, the antenna pattern 112 and the reinforcing layer 14 are formed. Next, the antenna resist layer 115 and the reinforcing resist layer 116 are removed. Thereby, as shown in Part (d) of FIG. 3, the base body 11 in which the antenna pattern 112 and the reinforcing layer 14 have been formed on the film 111 can be obtained. In the process described later, of the base body 11, the IC chip 12 will be mounted in the mounting area 11c of the mounting surface 11a on which the antenna pattern 112 has been formed. Additionally, the reinforcing layer 14 that suppresses expansion and contraction of the film 111 is formed on the rear area 11d opposite the mounting area 11c with the film 111 interposed between the mounting area 11c and the rear area 11d. In the present embodiment, the reinforcing layer 14 has been formed larger than the rear area 11d.

Here, the process of forming a conductor shown in Part (a) to Part (d) of FIG. 3 corresponds to each example of the step of forming a conductive pattern and the step of forming a reinforcing layer according to the present invention, and in this process of forming a conductor, the process corresponding to the step of forming a conductive pattern and the step of forming a reinforcing layer are executed simultaneously.

Next, in the adhering process shown in Part (e) of FIG. 3, a liquid thermosetting adhesive 13p is adhered onto the base body 11. The thermosetting adhesive 13p is pasted on the mounting area 11c and its surrounding area of the mounting area 11a of the base body 11 on which the IC chip 12 will be mounted (See Part (d)).

Next, in the mounting process shown in Part (f) to Part (g) of FIG. 3, the IC chip 12 is placed on the mounting area 11c. The IC chip 12 is placed on the base body 11 by a flip-chip technique. That is, the IC chip 12 is placed on the base body 11 via the thermosetting adhesive 13p in such a way that a surface 12a on which the circuit has been formed faces the base body 11. On the surface 12a on which the circuit of the IC chip 12 has been formed, bumps 121 that are to be connected to the antenna pattern 112 is formed. As shown in Part (f) of FIG. 3, the IC chip 12 is placed on the base body 11 in such a way that the bumps 121 are aligned with the antenna pattern 112.

Next, in pinching process shown in Part (h) of FIG. 4, the base body 11 on which the IC chip 12 has been placed is pinched by a heating device 2 that includes a heating head 21 and a heating stage 22 such that the heating head 21 abuts the IC chip 12 and the heating stage 22 abuts to support the base body 11 on which the IC chip 12 has been placed. In other words, the base body 11 is held between the heating head 21 and heating stage 22. To be more specific, the heating stage 22 abuts the reinforcing layer 14 disposed at the backside 11b of the base body 11. In addition, the heating head 21 includes a built-in heater that is not shown. The pinching process shown in Part (h) of FIG. 4 causes the bumps 121 to surely contact the antenna pattern 112.

Also, as the reinforcing layer 14 of the present embodiment has been formed larger than the rear area 11d (See Part (d) of FIG. 3), the reinforcing layer 14 includes the portions (positions) corresponding to the bumps 121. Because of this, by the pinching process shown in Part (h) of FIG. 4, a state is brought about in which the film 111 is interposed between the antenna pattern 112 that contacts the IC chip 12 via the bumps 121 and the reinforcing layer 14 that is formed opposed to the bumps 121 and includes the portions corresponding to the bumps 121.

Next, in the heating process shown in Part (i) of FIG. 4, the heating head 21 is heated to harden the thermosetting adhesive 13p by the heating. By hardening the thermosetting adhesive 13p, the bumps 121 are fixed to the base body 11 in such a state where the bumps 121 contacts the antenna pattern 112.

Since the reinforcing layer 14 that suppresses expansion and contraction of the film 111 has been formed on the rear area 11d at the backside of the mounting area 11c where the IC chip 12 will be mounted, even though the film 111 melts by the heating, deformation of the film 111 can be suppressed. Moreover, since the film 111 is sandwiched between the antenna pattern 112 in contact with the IC chip 12 via the bumps 121 and the reinforcing layer 14 that is formed opposed to the bumps 121 and includes the portions corresponding to the bumps 121, expansion and contraction of the film 111 can be further suppressed. As a result of this, it is possible to suppress generation of voids in the thermosetting adhesive 13p accompanying the deformation of the film.

When heating process in Part (i) of FIG. 4 finishes, the RFID tag 1 (See FIG. 1) is completed.

The heating device 2 corresponds to one example of the manufacturing device of the electronic device in the present invention; the heating head 21 corresponds to a combination of one example of the pressing section and one example of the heating section; and the heating stage 22 corresponds to one example of the supporting section of the present invention.

Next, an explanation will be made for the second embodiment of the present invention in which materials of the reinforcing layer are different from those in the first embodiment. In the second embodiment described below, the explanation will focus on the features different from the first embodiment, by utilizing the drawings referred to in the explanation of the first embodiment.

Since the RFID tag of the second embodiment has the same appearance as the RFID tag 1 shown in FIGS. 1 and 2, in the following, the RFID tag of the second embodiment will be explained by utilizing FIGS. 1 and 2. In the RFID tag of the second embodiment, the reinforcing layer is formed of an insulating material, which is different from the RFID tag of the first embodiment. Because of this, the RFID tag of the second embodiment does not hinder electromagnetic waves emitted from the antenna pattern 112. In addition, it is possible to adopt ceramics and resign as a material of the reinforcing layer 14.

Figure 5:
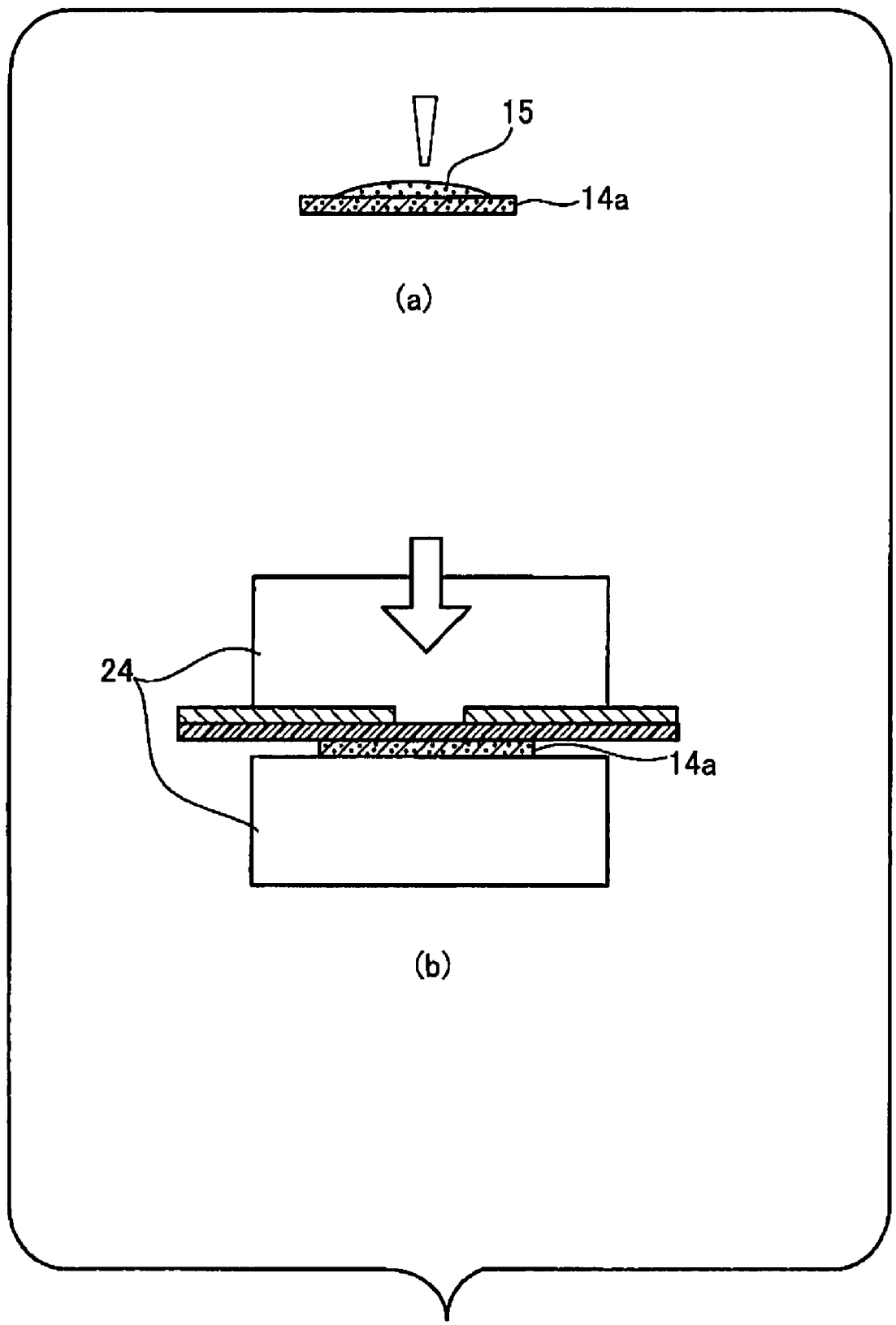
FIG. 5 is a drawing illustrating process of manufacturing a RFID tag according to a second embodiment of the present invention.

FIG. 5 is a drawing illustrating process of manufacturing the RFID tag of the second embodiment according to the present invention.

The process of manufacturing a RFID tag of the second embodiment is different from that of the first embodiment shown in FIG. 3 in that in the process of forming a conductor shown in Part (a) to Part (d) of FIG. 3, only the antenna pattern 112 is formed whereas the reinforcing layer 14 is not formed. In the step of manufacturing a RFID tag of the second embodiment, after the antenna pattern 112 has been formed, as shown in Part (a) of FIG. 5, an adhesive 15 is pasted on a sheet 14a made of an insulating material. Then, as shown in Part (b) of FIG. 5, the sheet 14a is attached to the backside of the film 111, which is then adhered tightly by pinching with a pressing device 24 to form the reinforcing layer. After this, the same steps as shown in Part (e) of FIG. 3 to FIG. 4 are executed to obtain the RFID tag of the second embodiment. The press shown in Part (b) of FIG. 5 in which the sheet 14a is attached corresponds to one example of the step of forming a reinforcing layer according to the present invention.

Next, an explanation will be made about the third embodiment of the present invention, focusing the differences between the third embodiment and the first and second embodiments, using the same reference characters as in the first embodiment for the common configuration with the first embodiment.

Figure 6:
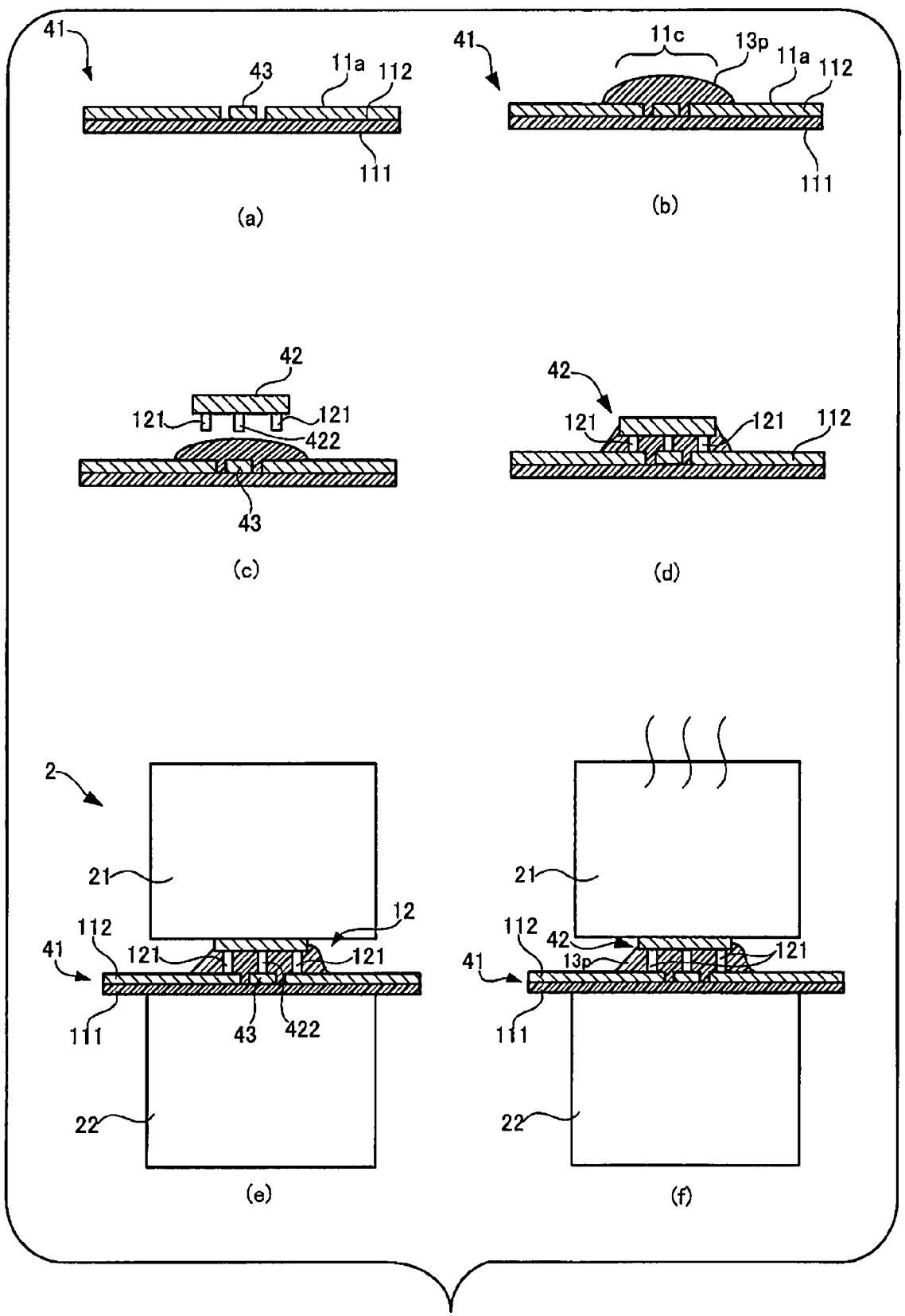
FIG. 6 is a drawing illustrating process of manufacturing a RFID tag according to a third embodiment of the present invention.

FIG. 6 is a drawing illustrating the process of manufacturing the RFID tag of the third embodiment according to the present invention.

In FIG. 6, each process of manufacturing the RFID tag of the third embodiment is sequentially shown from Part (a) to Part (e).

The RFID tag of the third embodiment has almost the same appearance as the RFID tag 1 of the first embodiment shown in FIG. 1. The RFID tag of the third embodiment is, however, different from the RFID tag 1 of the first embodiment in that the reinforcing layer is formed in the mounting area 11c, not on the rear area 11d (See FIG. 2).

In order to manufacture the RFID tag of the third embodiment, firstly, in the process of forming a conductor shown in Part (a) of FIG. 6, the antenna pattern 112 and a reinforcing layer 43 made of the same copper are formed simultaneously on the mounting surface 11a of the film 111.

Figure 7:
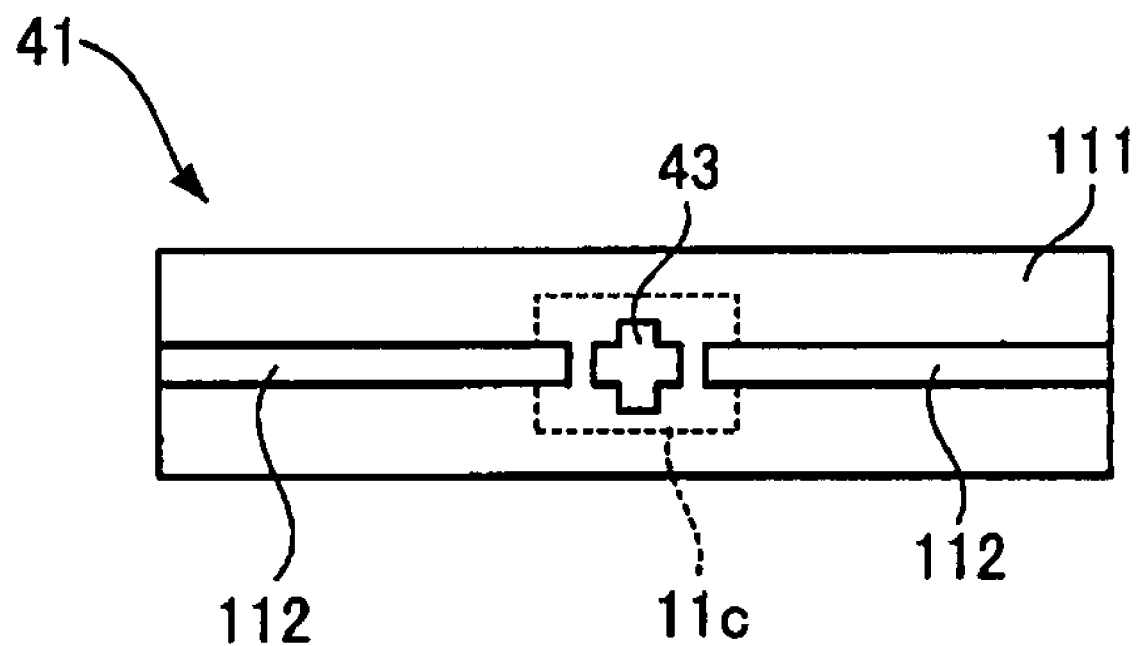
FIG. 7 is a plan view illustrating a base body formed in the process of forming a conductor shown in Part (a) of FIG. 6.

FIG. 7 is a plan view illustrating a base body formed in the step of forming a conductor shown in Part (a) of FIG. 6. As shown in FIG. 7, in the base body 41, the antenna pattern 112 and the reinforcing layer 43 are formed on the mounting surface 11a of the film 111. The reinforcing layer 43 is formed into a cruciform in a mounting area 11c on which an IC chip 42 is mounted.

The explanation continues by returning to FIG. 6. Next, in the adhering process shown in Part (b) of FIG. 6, the thermosetting adhesive 13p is adhered to the mounting area 11c and its surrounding area of the base body 41, then in the mounting process shown in Part (b) and Part (c) of FIG. 6, the IC chip 42 is placed on the mounting area 11c of the base body 41. On the IC chip 42, in addition to the bumps 121 that have been formed on a surface 12a on which the circuit has been formed and that connects to the antenna pattern 112, a dummy bump 422 that contacts the reinforcing layer 43 is formed. Although the reinforcing layer 43 and the dummy bump 422 do not possess any electrical function, they may be connected to the ground potential of the IC chip 42 in order to avoid, for example, a state of electrical floating.

Next, in pinching process shown in Part (e) of FIG. 6, the base body 41 on which the IC chip 42 has been mounted is pinched by the heating device 2. The film 111 is brought into a state of being held between the reinforcing layer 43 in contact with the IC chip 42 via the dummy bump 422 and the heating stage 22.

Next, in the heating process shown in Part (f) of FIG. 6, the heating head 21 is heated to harden the thermosetting adhesive 13p by the heating. By hardening the thermosetting adhesive 13p, the IC chip 42 is fixed to the base body 41 in a state where the bumps 121 is in contact with the antenna pattern 112.

Since the reinforcing layer 43 has been formed on the mounting area 11c on the film 111, it is possible to suppress expansion and contraction of the film 111. Therefore, even though the film 111 melts by heating, the deformation of the film 111 can be suppressed. Moreover, since the film 111 is sandwiched between the reinforcing layer 43 in contact with the IC chip 42 via the dummy bump 422 and the heating stage 22, expansion and contraction of the film 111 can be suppressed more effectively. As a result of this, it is possible to suppress generation of voids in the thermosetting adhesive 13p accompanying the deformation of the film.

As described above, the explanation has been made about the third embodiment. Hereafter, variations of the third embodiment will be described, which are different from the third embodiment in their shape and placement of the antenna pattern and the reinforcing layer 43.

Figure 8:
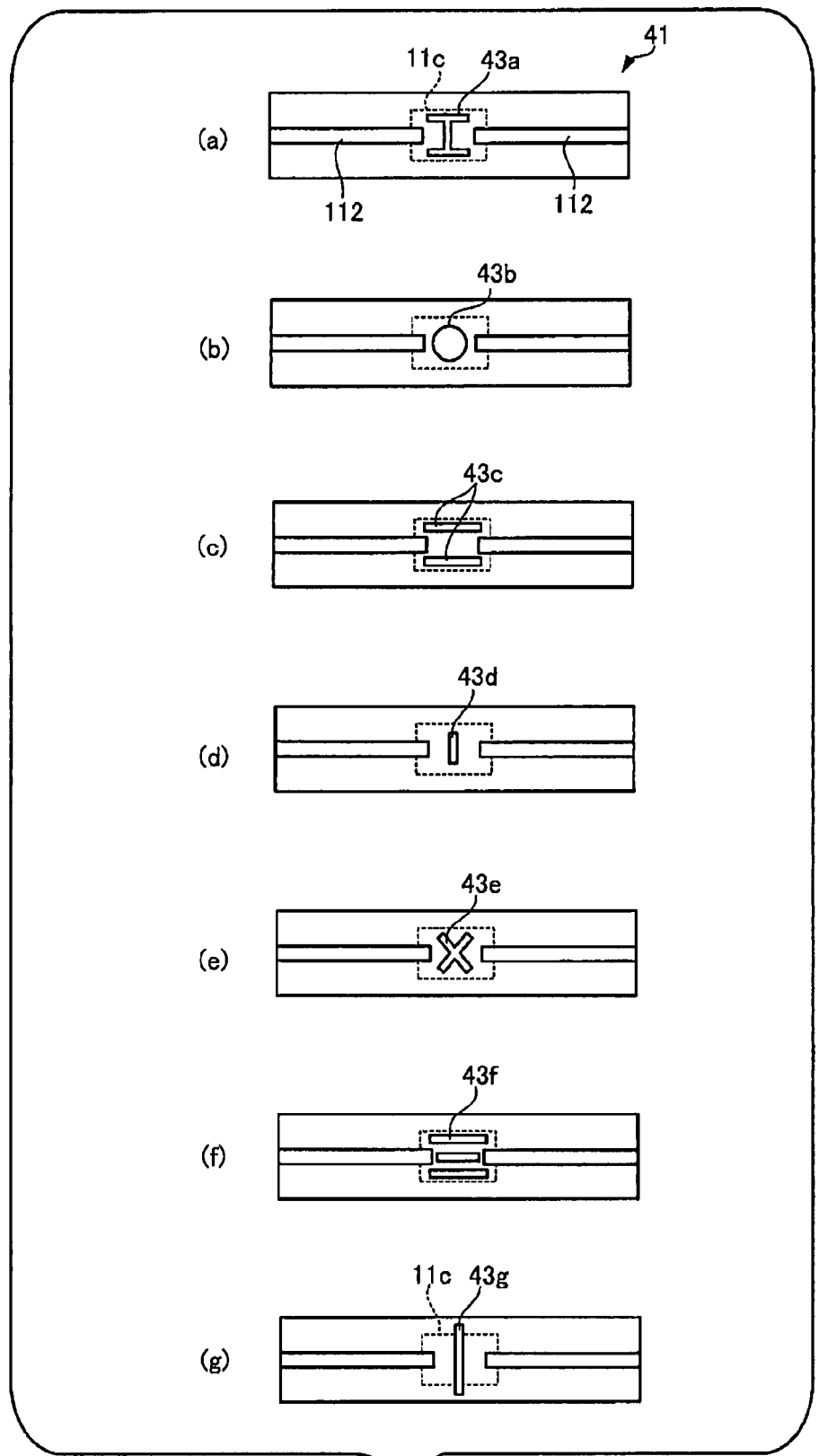
FIG. 8 is a plan view illustrating examples of another forms of the RFID tag according to the third embodiment of the present invention.
Figure 9:
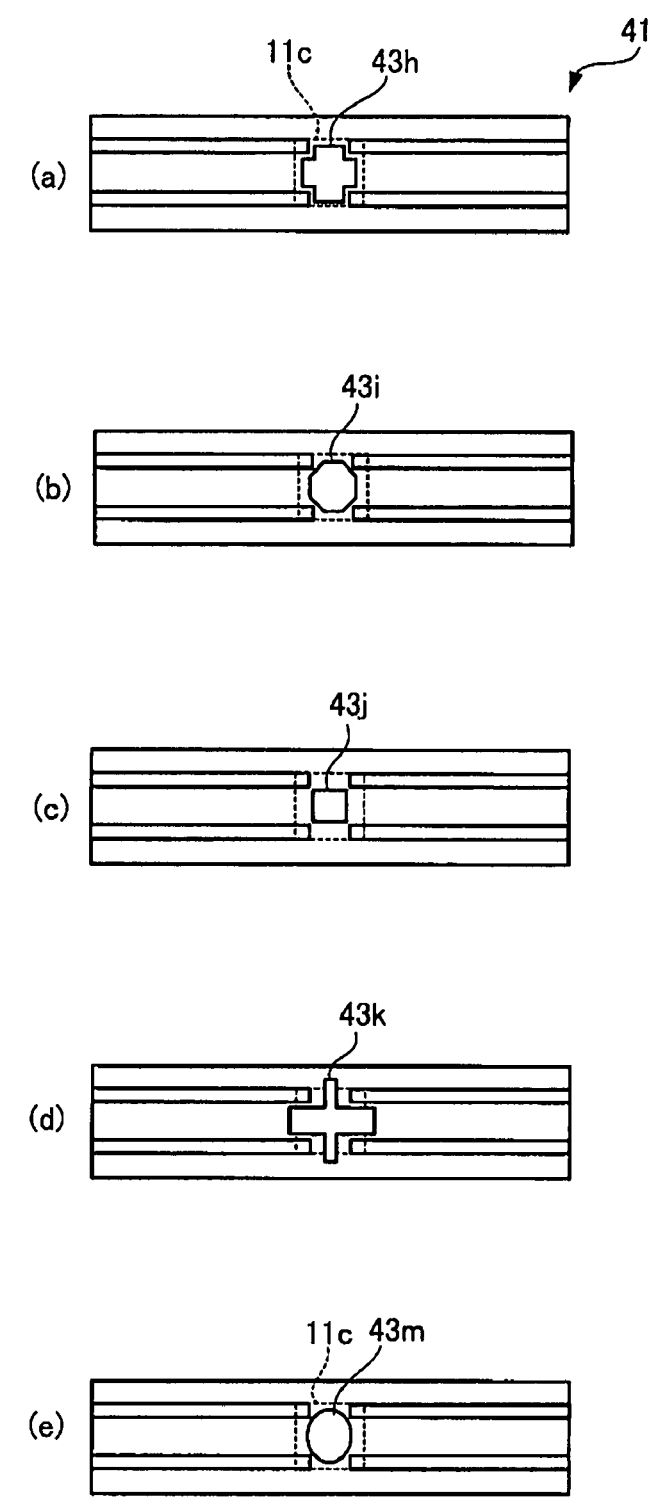
FIG. 9 is a plan view illustrating examples of yet another forms of the RFID tag according to the third embodiment of the present invention.
Figure 10:
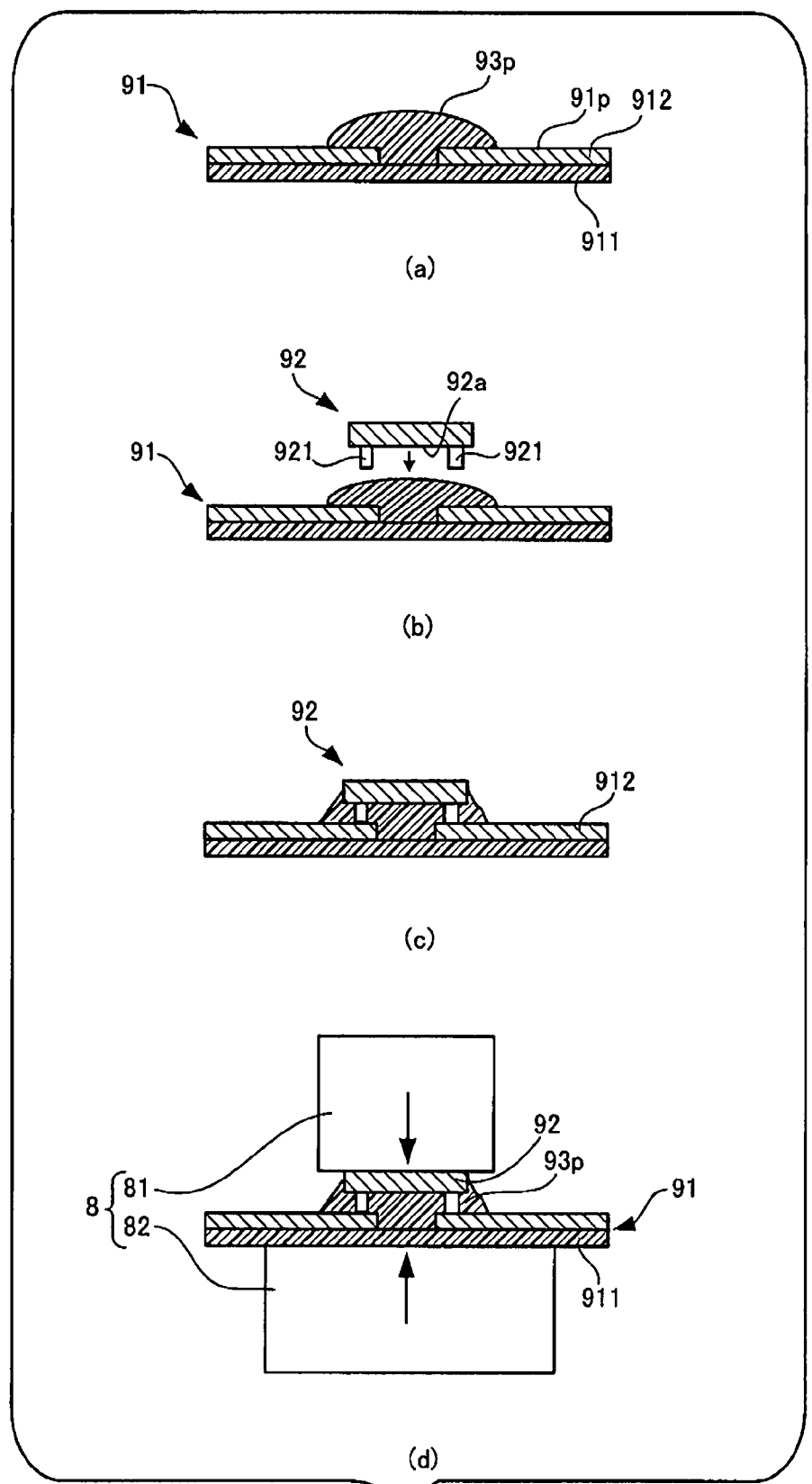
FIG. 10 is a diagram explaining a conventional method of manufacturing a RFID tag.
Figure 11:
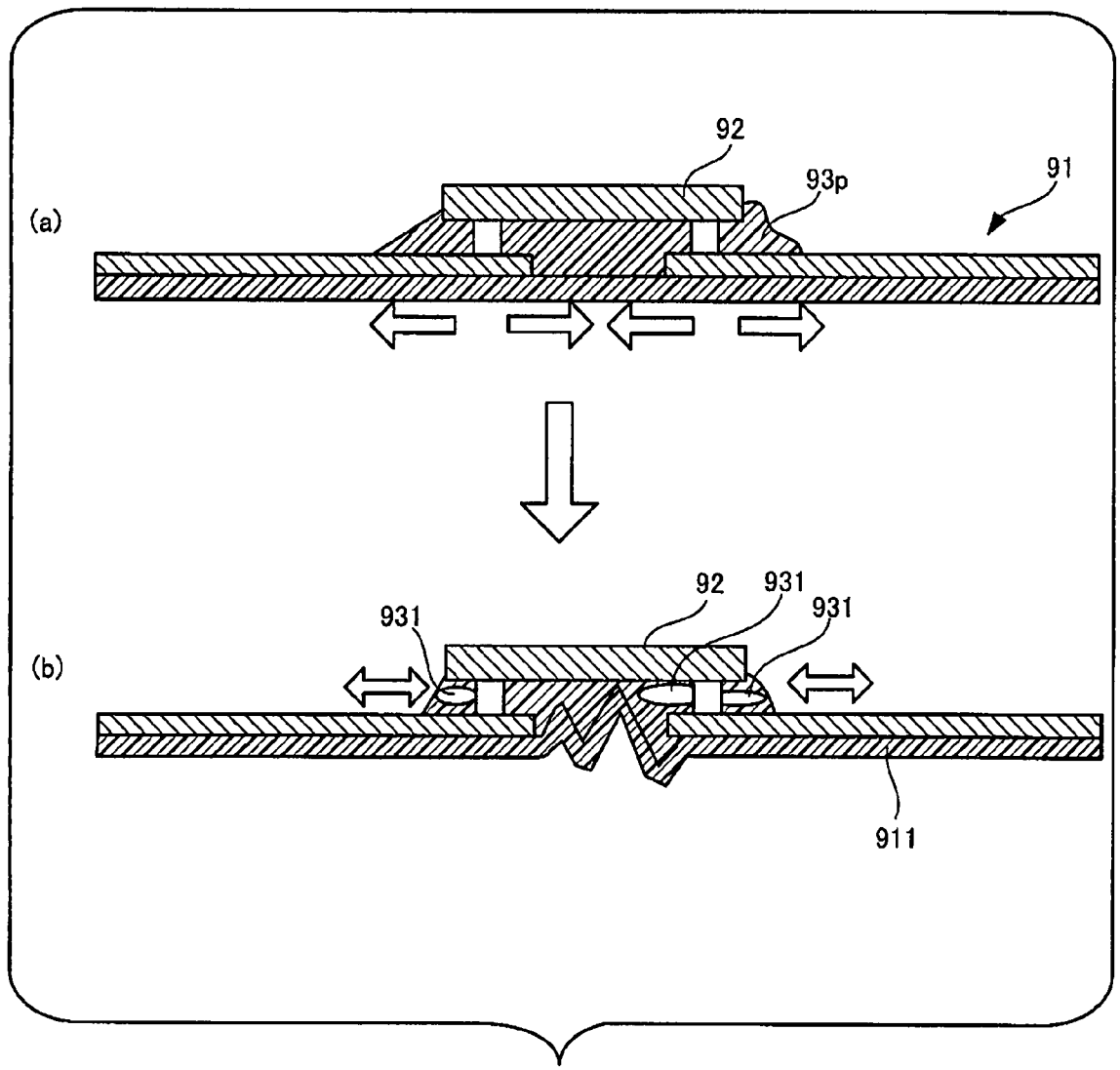
FIG. 11 is a diagram explaining a state of the base body in the heating process in FIG. 10.

FIGS. 8 and 9 are plan views illustrating variations of the RFID tag of the third embodiment according to the present invention.

In FIGS. 8 and 9, the base body 41 is shown, in which the IC chip is removed from the RFID tag. Part (a) to Part (g) of FIG. 8, similar to FIG. 7, show seven examples in each of which two antenna patterns 112 are formed. Further, Part (a) to Part (e) of FIG. 9 show five examples in each of which four antenna patterns 112 are formed.

A reinforcing layer 43a shown in Part (a) of FIG. 8 is shaped like letter H; a reinforcing layer 43b shown in Part (b) is circular; a reinforcing layer 43c shown in Part (c) is two straight lines extending parallel to the direction the antenna pattern 112 extends; reinforcing layers 43d and 43g shown in Part (d) and Part (g) are straight lines perpendicular to the direction the antenna pattern 112 extends; a reinforcing layer 43e shown in Part (e) is shaped like letter X; and a reinforcing layer 43f shown in Part (f) is three straight lines extending parallel to the direction the antenna pattern 112 extends.

Furthermore, reinforcing layers 43h and 43k shown in Part (a) and Part (d) of FIG. 9 are cruciform; a reinforcing layer 43i shown in Part (b) is octagon; a reinforcing layer 43j shown in Part (c) is rectangular; and a reinforcing layer 43m shown in Part (e) is circular.

Although the reinforcing layers 43a to 43m are formed in the mounting area 11c, these layers may be formed by their part extending off the mounting area 11c, as shown in Part (g) of FIG. 8 and Part (d) of FIG. 9.

Additionally, although in the above-described embodiments, descriptions are made on the method of manufacturing the RFID tag and the heating device. The present invention is, however, not limited to a RFID tag and may be also applied to a method of manufacturing any other electronic device in which a circuit chip is mounted on a film-like base. For example, the present invention may be employed to a manufacturing method of an ultrathin IC card, or a printed circuit board in which a circuit chip is fixed to a flexible printed circuit (FPC) as a base with a thermoset adhesive.

Still more, in the above-described embodiments, the film composing the base section of the RFID tag is made of a PET material. However, the film of the electronic device according to the present invention is not limited to the PET material, and may be made of materials selected from a polyester material, a polyolefin material, a polycarbonate material, an acrylic material and so on.

Moreover, in the above-described embodiments, the heating head corresponds to an example of the pressing section according to the present invention and serves as a heater, whereas the heating stage does not have function of heating. The present invention, however, is not limited to this, and it is also possible to provide the supporting section with heating function and to provide a heating section as another section, separately from the heating stage and heating head.

What is claimed is:

1. A method of manufacturing an RFID tag, comprising:
   forming an antenna pattern and a reinforcing layer on one surface of a film made of a resin material;
   applying a thermosetting adhesive onto the reinforcing layer and the antenna pattern;
   mounting a circuit chip on the antenna pattern via the thermosetting adhesive;
   pinching the circuit chip and the other surface of the film; and
   fixing the circuit chip to the antenna pattern by hardening the thermosetting adhesive,
   wherein the reinforcing layer is formed within a region where the circuit chip is mounted, and
   wherein the circuit chip includes a first protrusion contacting the antenna pattern and a second protrusion contacting the reinforcing layer.

2. The method of manufacturing an RFID tag according to claim 1, wherein the step of forming the reinforcing layer is executed in conjunction with the step of forming the antenna pattern in which the reinforcing layer is formed of the same material as the antenna pattern.

3. The method of manufacturing an electronic device according to claim 1, wherein the step of mounting is a step of mounting a circuit chip on the base body, the circuit chip having a plurality of first protrusions that contact the conductive pattern, and
   the step of forming the reinforcing layer is a step of forming in the rear area the reinforcing layer which has portions corresponding to the plurality of first protrusions.

4. The method of manufacturing an electronic device according to claim 3, wherein the step of forming the reinforcing layer is a step of forming the reinforcing layer of an insulating material.

* * * * *